United States Patent
Leung

(10) Patent No.: US 8,922,158 B2
(45) Date of Patent: Dec. 30, 2014

(54) PORTABLE ELECTRONIC DEVICE CHARGEABLE VIA AT LEAST ONE SPEAKER PORT

(75) Inventor: Kwok Ching Leung, Richmond Hill (CA)

(73) Assignee: Blackberry Limited, Waterloo, Ontario (CA)

(*) Notice: Subject to any disclaimer, the term of this patent is extended or adjusted under 35 U.S.C. 154(b) by 461 days.

(21) Appl. No.: 13/252,330

(22) Filed: Oct. 4, 2011

(65) Prior Publication Data
US 2013/0082656 A1   Apr. 4, 2013

(51) Int. Cl.
| | | |
|---|---|---|
| *H02J 7/00* | (2006.01) | |
| *H04B 1/00* | (2006.01) | |
| *H04M 1/38* | (2006.01) | |
| *G06F 1/16* | (2006.01) | |
| *G06F 1/26* | (2006.01) | |
| *H05K 5/02* | (2006.01) | |
| *H04M 1/03* | (2006.01) | |
| *H04M 1/02* | (2006.01) | |

(52) U.S. Cl.
CPC ............. *G06F 1/1688* (2013.01); *H02J 7/0042* (2013.01); *G06F 1/26* (2013.01); *H05K 5/0247* (2013.01); *H04M 1/03* (2013.01); *H04M 1/0274* (2013.01)
USPC ........... 320/107; 320/112; 320/113; 320/115; 455/567; 455/573

(58) Field of Classification Search
CPC   Y02E 60/12; H01M 2/1022; H01M 2220/30; H01M 10/46; H01M 2/1005; H01M 2/1055; G06F 1/1688; G06F 1/26; H02J 7/0042; H05K 5/0247
USPC ................................ 320/107, 112, 113, 115
See application file for complete search history.

(56) References Cited

U.S. PATENT DOCUMENTS

| | | | |
|---|---|---|---|
| 5,136,639 A | | 8/1992 | Brito |
| 5,738,954 A | * | 4/1998 | Latella et al. ................... 429/97 |
| 5,783,999 A | * | 7/1998 | Price et al. .................... 340/664 |
| 5,889,383 A | * | 3/1999 | Teich .............................. 320/107 |
| 5,896,024 A | * | 4/1999 | Bradus et al. ................. 320/125 |
| 7,656,120 B2 | * | 2/2010 | Neu et al. ...................... 320/112 |
| 8,150,460 B1 | * | 4/2012 | Curtis et al. .................. 455/557 |
| 8,405,512 B2 | * | 3/2013 | Johnson ........................ 340/635 |

(Continued)

OTHER PUBLICATIONS

Electrostatic Tweeter Repair and Restoration http://ppinyot.com/electrostatic_tweeter.htm downloaded from the internet on Oct. 13, 2011.

(Continued)

*Primary Examiner* — M'Baye Diao
(74) *Attorney, Agent, or Firm* — Perry + Currier Inc.

(57) ABSTRACT

A portable electronic device chargeable via at least one speaker port is provided. The portable electronic device comprises a housing containing: a processing unit, a least one speaker for playing audio signals; a power pack for powering the portable electronic device, including the processing unit; and a charging circuit electrically connected to the power pack for charging the power pack from an external power source. The portable electronic device further comprises at least one speaker port for enabling sound from the at least one speaker to exit the housing, the at least one speaker port enabled to convey power from the external power source to the charging circuit such that the power pack is chargeable via the at least one speaker port.

20 Claims, 16 Drawing Sheets

(56) References Cited

U.S. PATENT DOCUMENTS

| | | | |
|---|---|---|---|
| 8,432,124 B2* | 4/2013 | Foster | 320/101 |
| 2009/0185045 A1 | 7/2009 | Rosenblatt et al. | |
| 2009/0280871 A1 | 11/2009 | Hofer et al. | |
| 2010/0079106 A1* | 4/2010 | Graham | 320/115 |
| 2012/0194130 A1* | 8/2012 | Patino et al. | 320/112 |
| 2013/0082656 A1* | 4/2013 | Leung | 320/112 |

OTHER PUBLICATIONS

Corresponding European Patent Application No. 11 18 3878 Search Report dated Feb. 14, 2012.

* cited by examiner

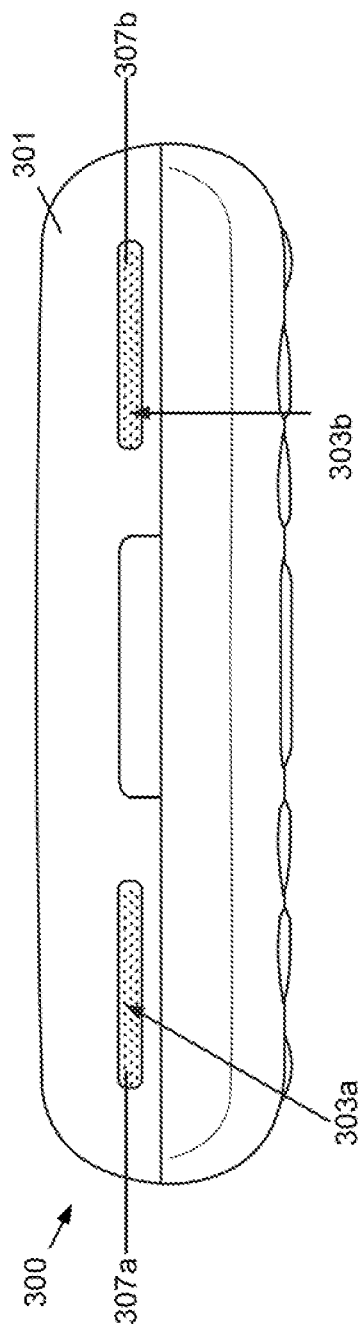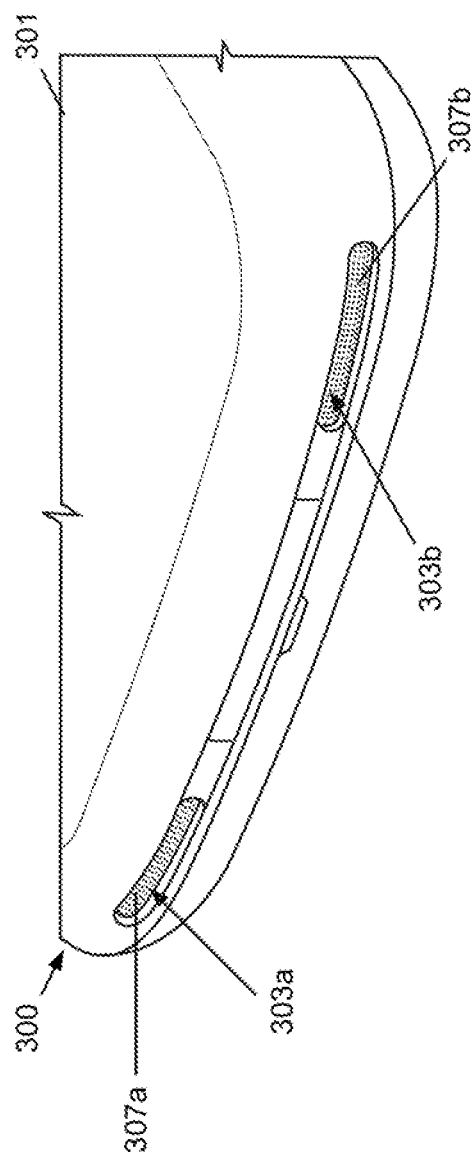

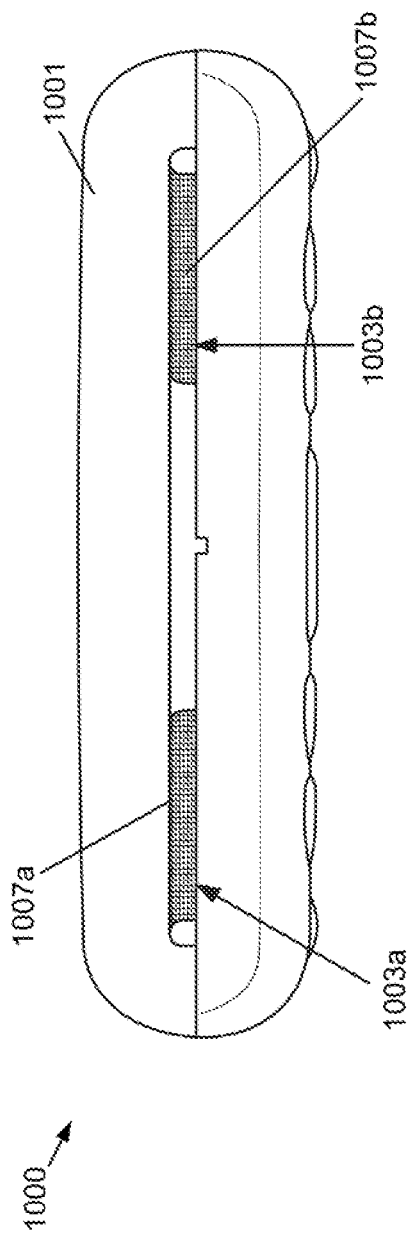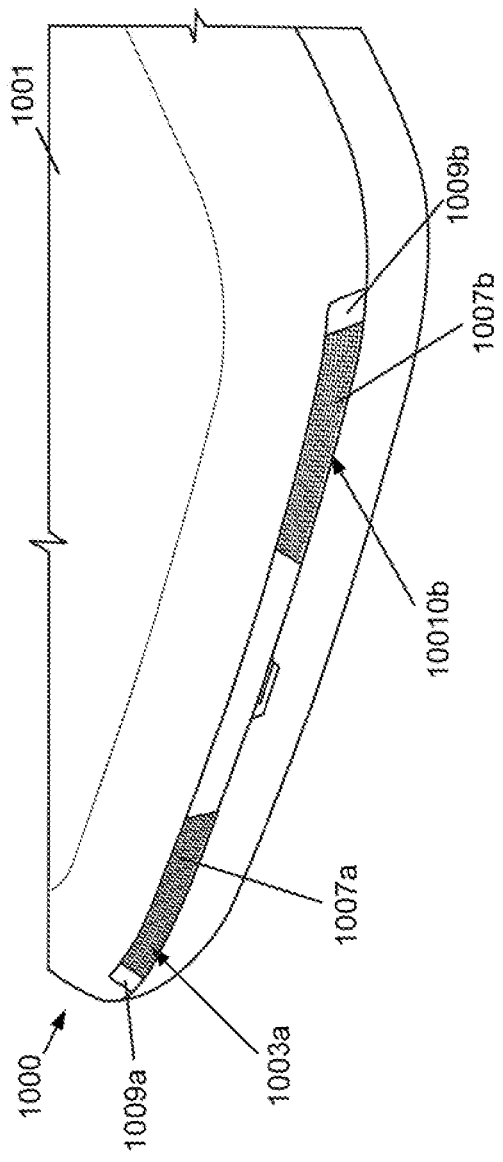
Fig. 10A
Fig. 10B

PORTABLE ELECTRONIC DEVICE CHARGEABLE VIA AT LEAST ONE SPEAKER PORT

FIELD

The specification relates generally to portable electronic devices, and specifically to a portable electronic device chargeable via at least one speaker port.

BACKGROUND

The evolution of computers is currently quite active in the portable device environment. There has been a veritable explosion of the number and type of portable electronic devices that are configured to the unique form factors and computing environments of mobile devices.

BRIEF DESCRIPTIONS OF THE DRAWINGS

For a better understanding of the various embodiments described herein and to show more clearly how they may be carried into effect, reference will now be made, by way of example only, to the accompanying drawings in which:

FIG. 3A depicts an end view of a portable electronic device chargeable via at least one speaker port, according to non-limiting implementations.

FIG. 3B depicts a perspective view of an end of a portable electronic device chargeable via at least one speaker port, according to non-limiting implementations.

FIG. 10A depicts an end view of a portable electronic device chargeable via at least one speaker port, according to non-limiting implementations.

FIG. 10B depicts a perspective view of an end of a portable electronic device chargeable via at least one speaker port, according to non-limiting implementations.

DETAILED DESCRIPTION OF THE EMBODIMENTS

Figure 1A:
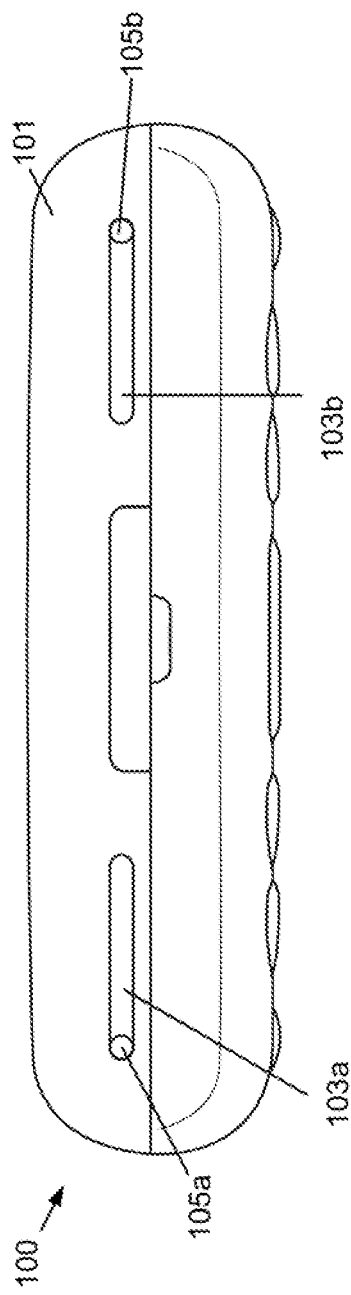
FIGS. 1A, 1B and 2 depict devices having separate conducting pins for charging a power pack in the device, according to the prior art.

In general, the following disclosure is directed to a portable electronic device chargeable via at least one speaker port. Examples of portable electronic devices include, but are not limited to, mobile communication devices (such as cellular phones or smart phones), music players (such as MP3 players), electronic navigation devices (such as Global Positioning System devices), portable DVD players, personal digital assistants (PDAs) and portable computers (such as tablet computers or laptop computers). Some portable electronic devices may be handheld, that is, sized and shaped to be held or carried in a human hand. In a typical implementation, the portable electronic device receives power via a conductive speaker grill, which can serve at least two functions: acting like an external electrode such that there is a conductive path for charging current; and acting as a protective element for the speaker port. An aspect of the specification provides a portable electronic device, comprising: a housing containing: a processing unit; at least one speaker for playing audio signals; a power pack for powering the portable electronic device, including the processing unit; and a charging circuit electrically connected to the power pack for charging the power pack from an external power source. The portable electronic device further comprises at least one speaker port for enabling sound from the at least one speaker to exit the housing, the at least one speaker port enabled to convey power from the external power source to the charging circuit such that the power pack is chargeable via the at least one speaker port.

The at least one speaker port can comprise a first speaker port associated with a first speaker and a second speaker port associated with a second speaker. The first speaker and the second speaker can comprise stereo speakers. The first speaker port can be enabled to electrically connect with a first electrode of the external power source and the second speaker port can be enabled to electrically connect with a second electrode of the external power source.

The at least one speaker port can comprise at least one speaker tube enabled to contact a respective electrode at the external power supply and convey power from the external power supply to the charging circuit.

The at least one speaker port can comprise at least one speaker grill covering the at least one speaker, the at least one speaker grill enabled to contact a respective electrode at the external power supply and convey power from the external power supply to the charging circuit. The at least one speaker grill can comprise a first portion and a second portion, the first portion enabled to electrically connect with a first electrode of the external power source and the second portion enabled to electrically connect with a second electrode of the external power source. The at least one speaker grill can comprise a split speaker grill with a first side of the split speaker grill enabled to electrically connect with a first electrode of the external power source and a second side of the split speaker grill enabled to electrically connect with a second electrode of the external power source. The at least one speaker grill can be one of: flush with an outer surface of the housing; recessed from the outer surface of the housing; external to the outer surface of the housing; and protruding from the outer surface of the housing. At least a portion of the at least one speaker port can comprise a mesh enabled to contact a respective electrode at the external power supply and convey power from the external power supply to the charging circuit. At least a portion of the mesh can comprise an electrode for contacting a respective electrode at the external power supply.

At least a portion of the at least one speaker port can comprise a female electrode enabled to receive a respective male electrode at the external power supply.

A portion of the housing comprising the at least one speaker port can be enabled to mate with a cradle comprising the external power supply, such that the at least one speaker port aligns with a respective electrode at the external power supply such that the at least one speaker port is in electrical contact with the respective electrode when the portable electronic device is in the cradle.

The at least one speaker port can comprise a conducting material. The conducing material can comprise at least one of a metal, a metal coating, stainless steel, titanium, and gold.

The housing can be enabled to be at least one of held and carried by a human hand.

The portable electronic device can further comprise at least one of a portable communication device, a PDA (personal digital assistant), an MP3 player, and a mobile telephone.

Another aspect of the specification provides a power supply for powering a portable electronic device, comprising: a cradle for receiving a housing of the portable electronic device, the housing containing a charging circuit electrically connected to a power pack for powering the portable electronic device and at least one speaker therein; apparatus for charging the portable electronic device; and at least one electrode electrically connected to the apparatus, the at least one electrode enabled to contact at least one speaker port of the portable electronic device when the portable electronic device is received in the cradle, the speaker port enabled to convey power from the at least one electrode to the charging circuit such that the power pack is chargeable via the at least one speaker port.

The cradle can be enabled to cause the at least one speaker port to align with the at least one electrode, such that the at least one speaker port is in electrical contact with the respective electrode, when the portable electronic device is received in the cradle. The at least one electrode can be at least one of: spring loaded; a male portion enabled to mate with a female portion at the at least one speaker port; and a protrusion from the cradle enabled to contact the at least one speaker port.

Figure 1B:
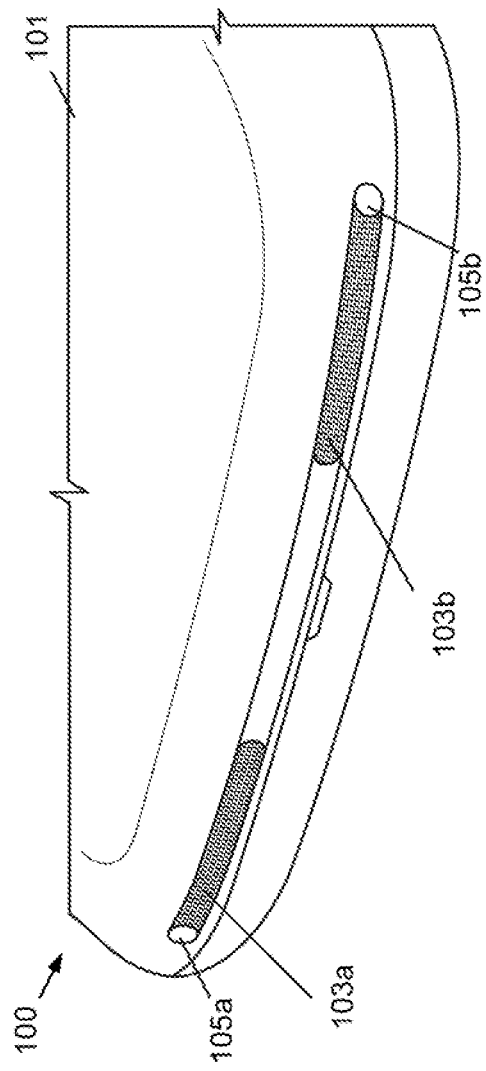

Prior to describing current implementations, attention is directed to FIGS. 1A and 1B which depict an end view and a perspective view, respectively, of a charging end of a portable electronic device 100 (also referred to hereafter as device 100) according to the prior art. Device 100 comprises a housing 101, and two speaker ports 103a, 103b (for purposes of simplicity and clarity, speaker ports 103a, 103b will be described as distinct from housing 101), as well as two conductive pins 105a, 105b for contacting respective electrodes in a charging cradle (not depicted), conductive pins 105a, 105b respectively located at either end of speaker ports 103a, 103b. It is appreciated that conductive pins 105a, 105b can also comprise, thin wire and/or or metal pads. In any event, such small contacts can be hard to locate in a charging cradle (not depicted), and may further require manufacturing considerations to precisely locate and/or insert conductive pins 105a, 105b in speaker ports 103a, 103b.

Figure 2:
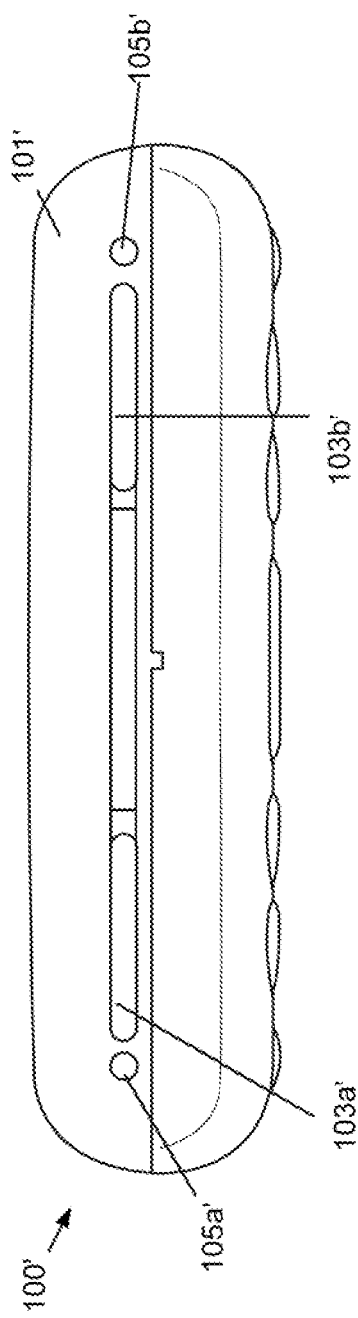

Similarly, attention also directed to FIG. 2, which depicts an end view of a charging end of a portable electronic device 100' (also referred to hereafter as device 100') according to the prior art. Device 100' is similar to device 100, with like elements having like numbers, however with a prime mark appended thereto. In these implementations, however, it is appreciated that conductive pins 105a', 105b' are respectively located adjacent to speaker ports 103a', 103b'. Hence, in addition to being hard to locate in a charging cradle (not depicted), and further require manufacturing to locate and/or insert conductive pins 105a', 105b' in housing 101', as well as milling of additional holes in housing 101' to accommodate conductive pins 105a', 105b'.

Attention is next directed to FIGS. 3A and 3B, which depict an end view and a perspective view, respectively, of a charging end of a portable electronic device 300 (also referred to hereafter as device 300) according to present implementations. Device 300 comprises a housing 301, and two speaker ports 303a, 303b (referred to collectively as speaker ports 303 and generically as a speaker port 303; note that this convention will be used hereafter). It is appreciated that speaker ports 303 comprise structures that enable sound from at least one speaker in device 300 to exit housing 301. However, speaker ports 303 are further enabled to convey power from an external power source to a charging circuit in device 300 such that a power pack in device 300 is chargeable via speaker ports 303. For example, each speaker port 303 comprises a respective speaker grill 307a, 307b, which comprises a conducting element that is electrically connected to the charging circuit in device 101: for example see FIG. 4, described hereafter. In general and as indicated by context, two elements are electrically connected when an electrical signal in one element can produce an electrical effect in the other. The two elements may be, but need not be, proximate to one another and may be, but need not be, physically connected to one another. In some cases, components that are electrically connected may be indirectly connected via one or more intermediate elements.

Figure 4:
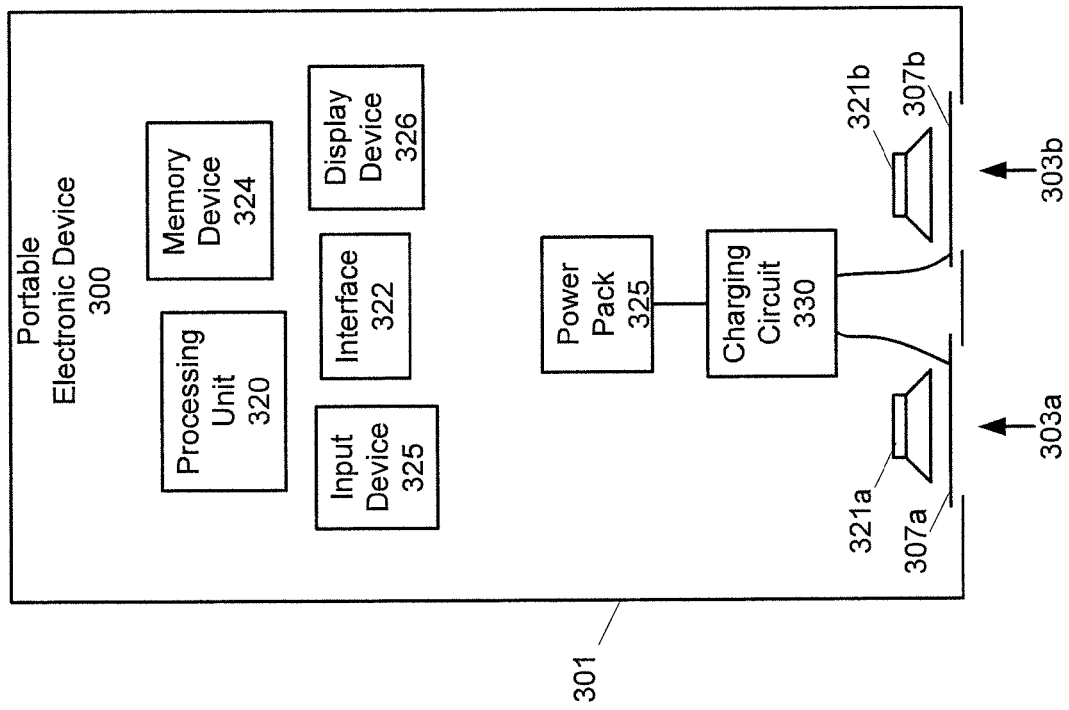
FIG. 4 depicts a schematic diagram of the portable electronic device of FIGS. 3A and 3B, according to non-limiting implementations.

Attention is directed to FIG. 4 which depicts elements of device 300, including a processing unit 320 interconnected with speakers 321a, 321b for playing audio signals. In general, audio signals are signals that are input to the speakers and result in output from the speakers in the form of sound (which may then pass through a speaker port). The process of transducing or converting an audio signal into sound will be referred to for simplicity as "playing" the audio signal. Audio signals may be in any format. Audio signals may encode any data that may be expressed as sound waves, such as (but not limited to) voice, music, sound effects, acoustic coupling signals, single- or multi-frequency tones and ringtones. Further, audio signals may arrive at the speaker from any source, or via any path, such as by being audio files (e.g., music) played by a media player or being transmitted from a remote location in real time (e.g., a phone message). In depicted implementations processing unit 320 is also interconnected with a memory device 322, a communication interface 324, a display device 326 and an input device 328, (as well as speakers 321) for example via a computing bus (not depicted). Processing unit 320, memory device 322, communication interface 324, and display device 326 will also be referred to hereafter as, respectively, processor 320, memory 322, interface 324 and display 326. It is appreciated that housing 301 is displayed schematically in FIG. 4, as are speaker ports 303 and speaker grills 307. In any event, it is appreciated from FIG. 4 that speaker grills 307 are electrically connected to a charging circuit 330, which in turn is electrically connected to a power pack 325, and hence are enabled to convey power from an external power source to charging circuit 330 such that power pack 325 is chargeable via speaker ports 303, e.g. speaker grills 307 in speaker ports 303.

It is further appreciated that power pack 325 is enabled to power device, including processor 320 and speaker 321, as well any other elements of device 300 that need power. Power pack 325 can include any suitable on-board source of power for powering device 300, including but not limited to one or more rechargeable batteries, batteries of similar or different chemistries, a battery combined with a super-capacitor, a fuel cell, or any other suitable energy storage and/or power supply combinations. For purposes of simplicity, the power pack will be discussed much as if it were a rechargeable battery.

Furthermore, it is appreciated that charging circuit 320 is electrically connected to power pack 325 to charge power pack 325 from an external power source, as will be describe below, and can include any suitable charging circuit including but not limited to a charging circuit for charging power pack 325 from a DC power supply, a charging circuit for charging power pack 325 from an AC power supply, and any suitable number of voltage up-converters or down-converters. Any other suitable components and/or charging circuits are within the scope of present implementations.

It is further appreciated that, device 300 comprises any suitable portable electronic device, including but not limited to any suitable combination of portable electronic devices, mobile computing devices, portable computing devices, tablet computing devices, laptop computing devices, PDAs (personal digital assistants), cellphones, smartphones, MP3 players, portable music players and the like. Other suitable portable electronic devices are within the scope of present implementations.

Housing 301 can comprise any suitable housing, casing, and the like, enabled to be at least one of held and carried by a human hand.

Processing unit 320 comprises any suitable processor, or combination of processors, including but not limited to a microprocessor, a central processing unit (CPU) and the like. Other suitable processing units are within the scope of present implementations. In particular, processing unit 320 is enabled to control speaker 321 to play audio signals.

Memory 322 can comprise any suitable memory device, including but not limited to any suitable one of, or combination of, volatile memory, non-volatile memory, random access memory (RAM), read-only memory (ROM), hard drive, optical drive, flash memory, magnetic computer storage devices (e.g. hard disks, floppy disks, and magnetic tape), optical discs, and the like. Other suitable memory devices are within the scope of present implementations. In particular, memory 322 can be enabled to store audio files to be played by speakers 321.

Optional communication interface 324 can comprise any suitable communication interface, or combination of communication interfaces. In particular interface 324 can be enabled to communicate wirelessly a communication network (not depicted). Accordingly, interface 324 can be enabled to communicate according to any suitable protocol which is compatible with the network, including but not limited to wireless protocols, cell-phone protocols, wireless data protocols, WiFi protocols, WiMax protocols, radio signal protocols and/or a combination, or the like. In some implementations, interface 324 can be enabled to receive audio signals to be played by speakers 321.

Input device 328 is generally enabled to receive input data, and can comprise any suitable combination of input devices, including but not limited to a keyboard, a keypad, a pointing device, a mouse, a track wheel, a trackball, a touchpad, a touch screen and the like. Other suitable input devices are within the scope of present implementations.

Display 326 comprises any suitable one of or combination of CRT (cathode ray tube) and/or flat panel displays (e.g. LCD (liquid crystal display), plasma, OLED (organic light emitting diode), capacitive or resistive touchscreens, and the like).

Speakers 321 can comprise any suitable speakers for playing audio signals. Speakers 321 are further enabled to be mounted in housing 301. It is yet further appreciated that speakers 321 are electrically isolated from speaker ports 303, including speaker grills 307 when present, so as to not interfere with charging of power pack 325. It is furthermore appreciated that, in some implementations first speaker 321*a* and second speakers 321*b* comprise stereo speakers.

Speaker grills 307 can comprise any suitable speaker grills, including but not limited to a conducting mesh for enabling sound to be transmitted from speakers 321 through ports 303 and out of housing 301. Further, it is appreciated that in depicted implementations, speaker grills 307 are electrically connected to suitable inputs on charging circuit 330 and are enabled to provide an electrical contact between an external power source and charging circuit 330. As such, speaker grills 307 comprise a conducing material, including but not limited to a metal, a metal coating (e.g. on a conducting or non-conducting base), stainless steel, titanium, and gold. It is appreciated that any other suitable conducting material is within the scope of present implementations. In addition to contributing to a current path or paths (e.g., to and from a charging circuit), by which a power pack may receive a charging current, the conductive grill can also serve conventional protective functions associated with a conventional speaker grill, such as protecting the speaker from contaminants or impacts.

It is yet further appreciated that in depicted implementations, speaker grills 307 are recessed from an outer surface of housing 301. However, other suitable arrangement of speaker grills 307 are within the scope of present implementations.

Figure 5:
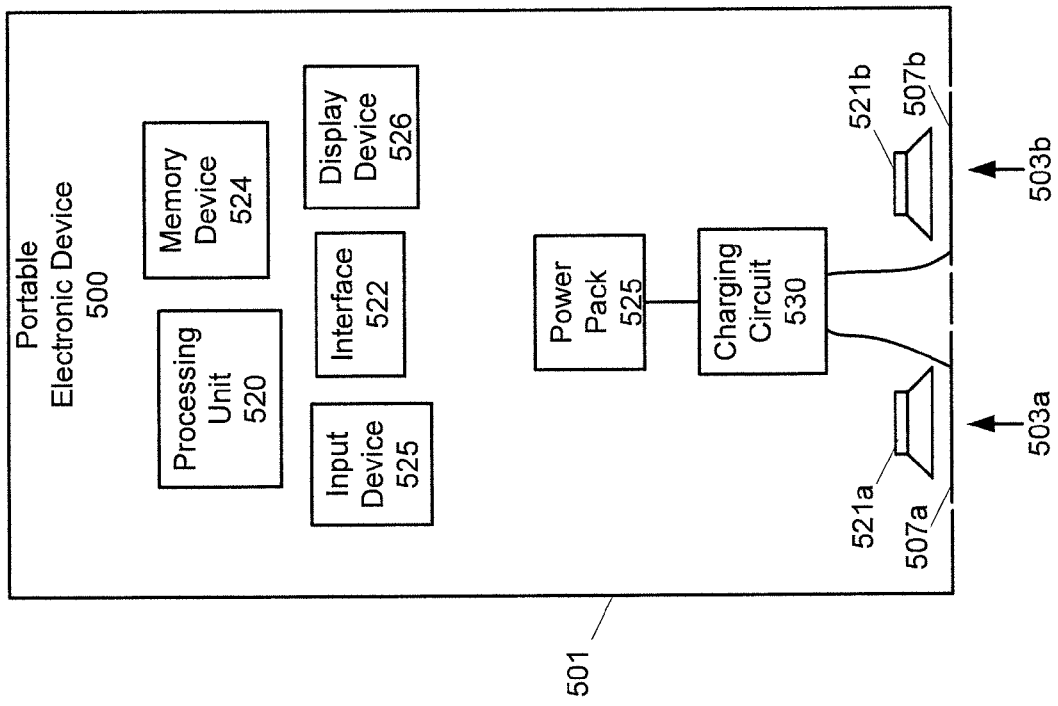
FIGS. 5 to 9 depict schematic diagrams of portable electronic devices chargeable via at least one speaker port, according to non-limiting implementations.

For example, attention is now directed to FIG. 5, which is substantially similar to FIG. 4, with like elements having like numbers, however preceded by a "5" rather than a "3". For example, device 500 is similar to device 300, however speaker grills 507 are mounted flush with an outer surface of housing 501.

Figure 6:
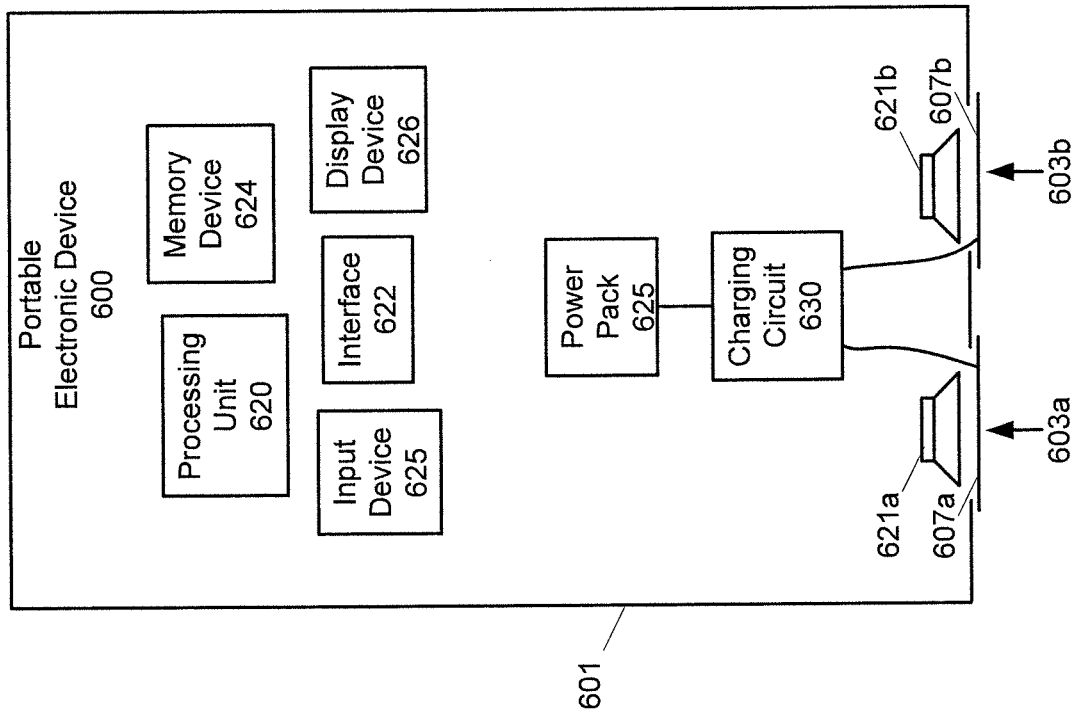

Attention is now directed to FIG. 6, which is substantially similar to FIG. 4, with like elements having like numbers, however preceded by a "6" rather than a "3". For example, device 600 is similar to device 300, however speaker grills 607 are mounted external to an outer surface of housing 601.

Figure 7:
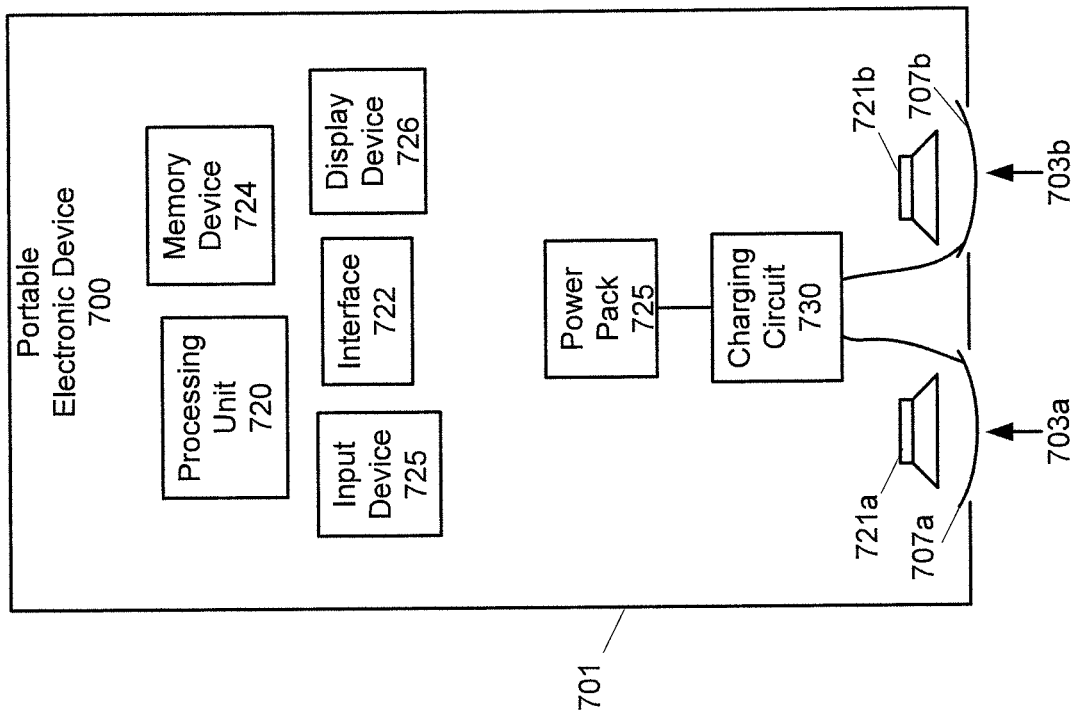

Attention is now directed to FIG. 7, which is substantially similar to FIG. 4, with like elements having like numbers, however preceded by a "7" rather than a "3". For example, device 700 is similar to device 300, however speaker grills 707 are protruding from an outer surface of housing 701 through speaker ports 703.

Figure 8:
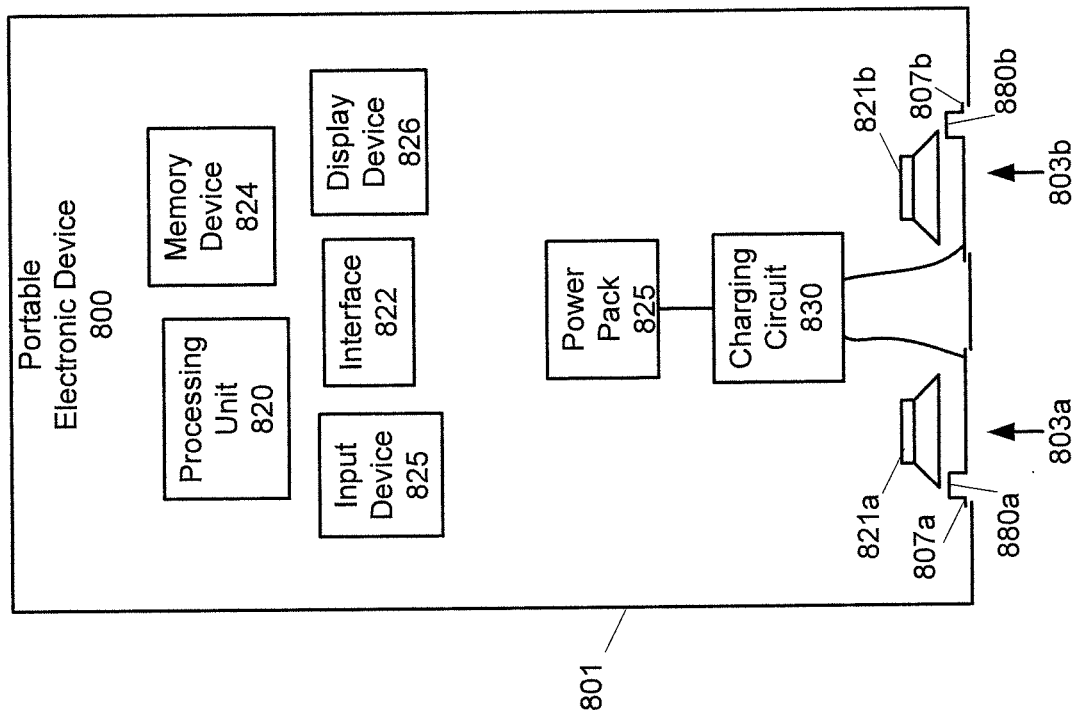
Figure 9:
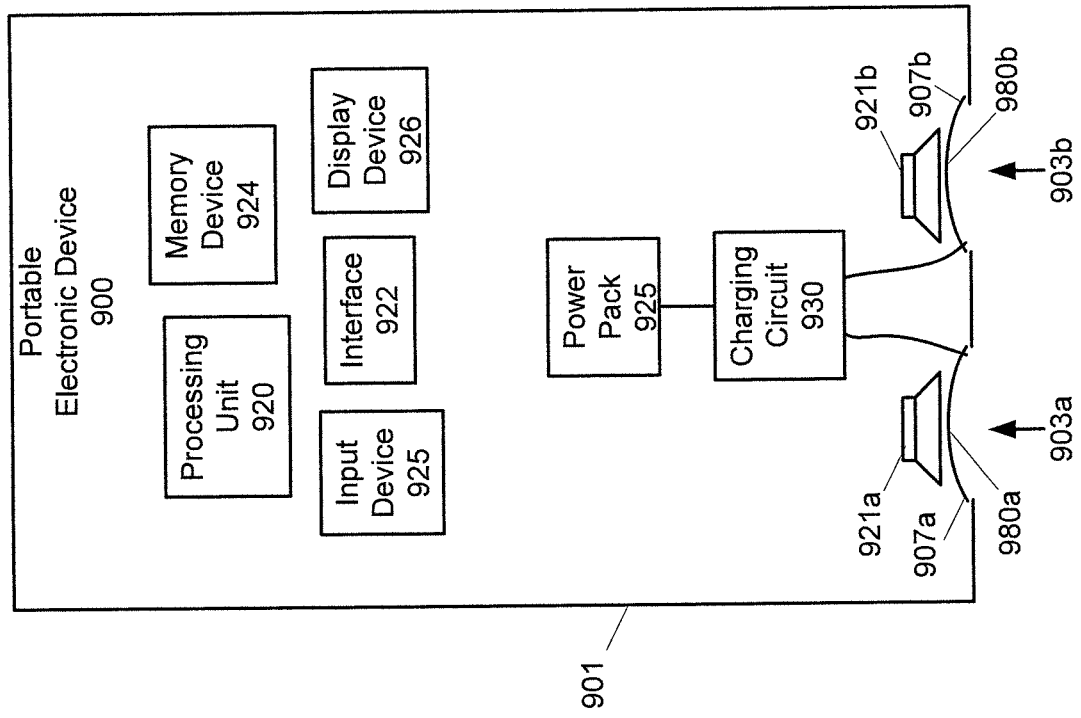

Attention is now directed to FIG. 8, which is substantially similar to FIG. 4, with like elements having like numbers, however preceded by an "8" rather than a "3". For example, device 800 is similar to device 300, however speaker grills 807 each respectively comprise a female portion 880*a*, 880*b* for accepting a male portion of a mating electrode at an external power supply (not depicted). While female portion 880 is depicted as rectangular in cross-section, the shape and size of female portion 880 is generally appreciated to be non-limiting and can be any suitable shape, and can further comprise any suitable portion of speaker grill 803. For example, in some implementations, female portion 880 can be a curved bowl-like shape which comprises a substantial portion of speaker grill 880, for example as depicted in FIG. 9; FIG. 9 is substantially similar to FIG. 8, with like elements having like numbers, preceded by a "9", rather than an "8" however female portion 980 is in the shape of a shallow inverted bowl.

While not depicted, it is further appreciated that any of speaker grills 307, 507, 607, 707, 807, 907 can be spring mounted in order to make better contact with a respective electrode at an external power supply, for example as depicted below with reference to FIG. 16.

Attention is next directed to FIGS. 10A and 10B, which are substantially similar to FIGS. 3A and 3B, respectively, with like elements having like numbers, however preceded by a "10" rather than a "3". For example, device 1000 is substantially similar to device 300, however each speaker grill 1007 comprises a respective portion 1009a, 1009b for contacting a respective electrode at an external power supply.

Figure 11:
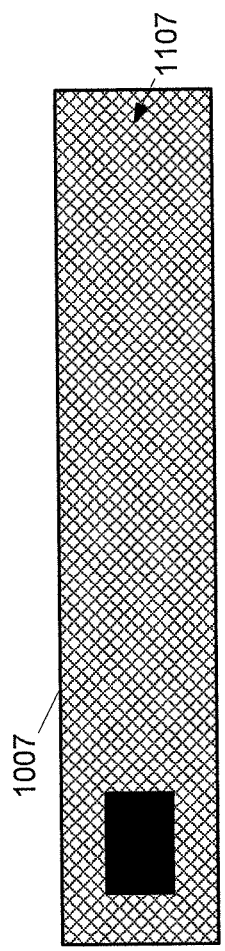
FIG. 11 depicts a speaker grill, according to non-limiting implementations.

For example, attention is directed to FIG. 11, which depicts speaker grill 1007 in more detail. From FIG. 11, it is appreciated that speaker grill 1007 comprises a mesh 1107, and portion 1009 comprises a portion of mesh 1107 that has been filled in and/or shaped into an electrode (e.g. a solid piece rather than a mesh). While portion 1009 is depicted as being off-centre from speaker grill 1007 in FIGS. 10A, 10B and 11, the location of portion 1009 is appreciated to be non-limiting.

Figure 12:
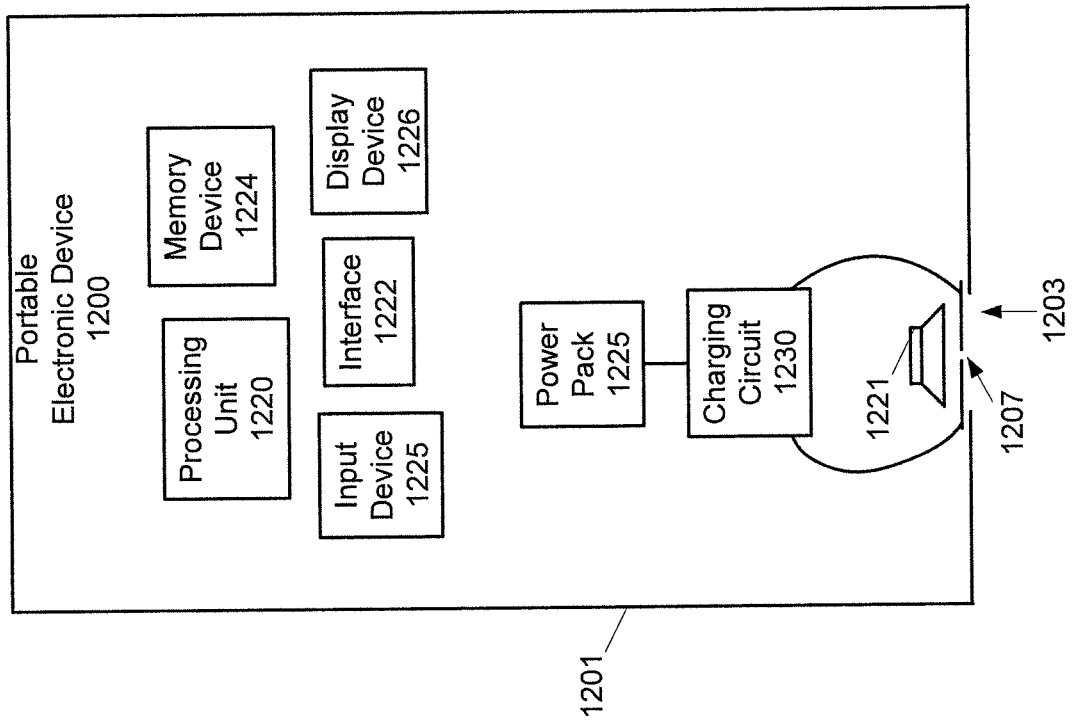
FIG. 12 depicts a schematic diagram of a portable electronic device chargeable via at least one speaker port, according to non-limiting implementations.
Figure 13:
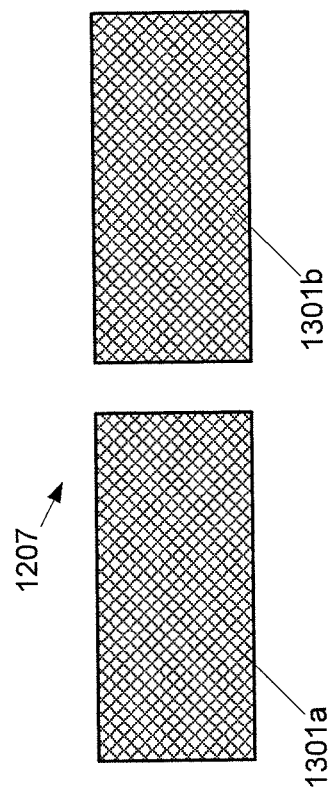
FIG. 13 depicts a split speaker grill, according to non-limiting implementations.

Attention is now directed to FIG. 12, which is substantially similar to FIG. 4, with like elements having like numbers, however preceded by a "12" rather than a "3". For example, device 1200 is similar to device 300, however device 1200 comprises only one speaker 1221 and one associated speaker port 1203. However as depicted in FIG. 13 in detail, speaker grill 1207 is split into two pieces, a first portion 1301a and a second portion 1301b, which are electrically isolated from one another and each independently electrically connected to charging circuit 1230. In other words, first portion 1301a is enabled to electrically connect with a first electrode of an external power source and second portion 1301b is enabled to electrically connect with a second electrode of the external power source. Further, each portion 1301 can be similar or different to one another, and can have any suitable shape, and or position with respect to housing 1201.

In other words, speaker grill 1207 comprises a split speaker grill with a first side of the split speaker grill enabled to electrically connect with a first electrode of an external power source and a second side of the split speaker grill enabled to electrically connect with a second electrode of the external power source.

Figure 14:
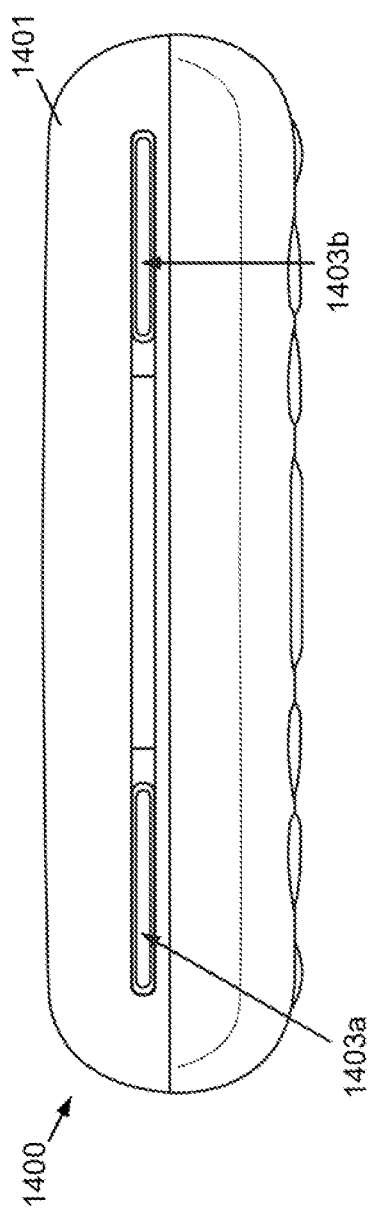
FIG. 14 depicts an end view of a portable electronic device chargeable via at least one speaker port, according to non-limiting implementations.
Figure 15:
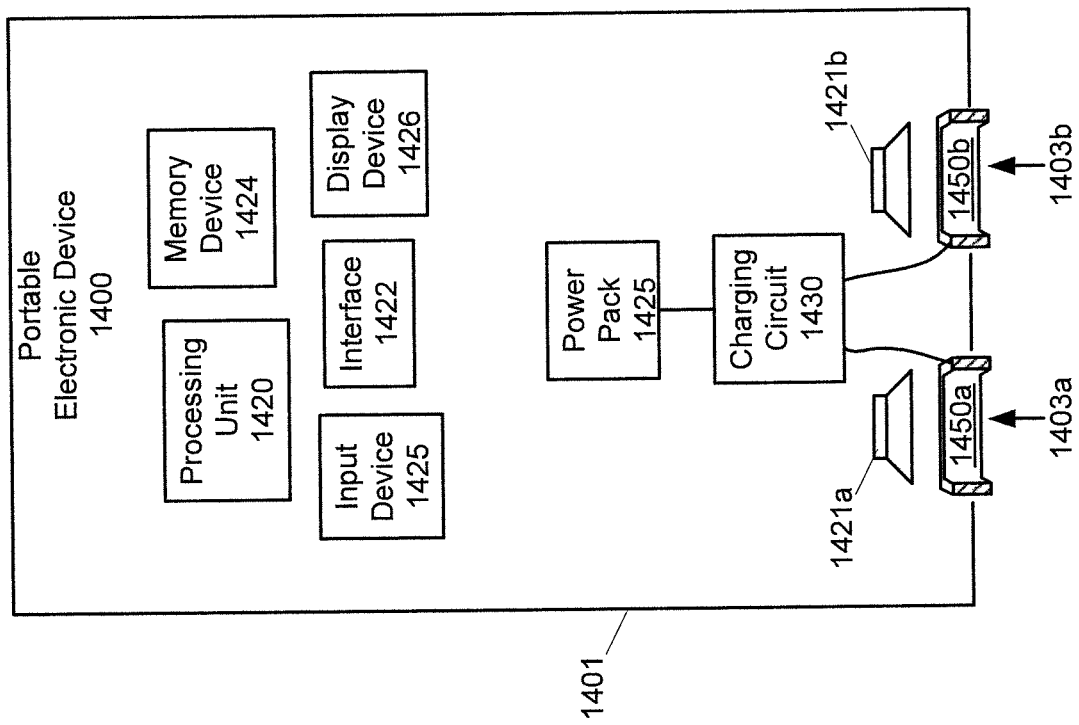
FIG. 15 depicts a schematic diagram of a portable electronic device chargeable via at least one speaker port, according to non-limiting implementations.

Attention is directed to FIGS. 14 and 15 which are substantially similar to FIG. 3A and 4, respectively, with like elements having like numbers, however preceded by a "14" rather than a "3". For example, device 1400 is similar to device 300, however speaker ports 1403 do not comprise a speaker grill. Rather, as depicted in cross section in FIG. 15, each speaker port 1403 respectively comprises a speaker tube 1450a, 1450b, each speaker tube 1450 enabled to contact a respective electrode at an external power supply and convey power from the external power supply to charging circuit 1430. Hence, it is appreciated that at least a portion of each speaker tune 1450 is appreciated to be conductive.

Hence, whether a speaker port comprises a speaker grill or a speaker tube (or other conductive element), and the like, in present implementations, it is appreciated that portable electronic devices in present implementations comprise at least one speaker port for enabling sound from at least one speaker to exit a housing, and that the at least one speaker port is further enabled to convey power from an external power source to a charging circuit such that a power pack is chargeable via the at least one speaker port. Hence, the need for separate charging electrodes is eliminated as compared to the prior art.

Figure 16:
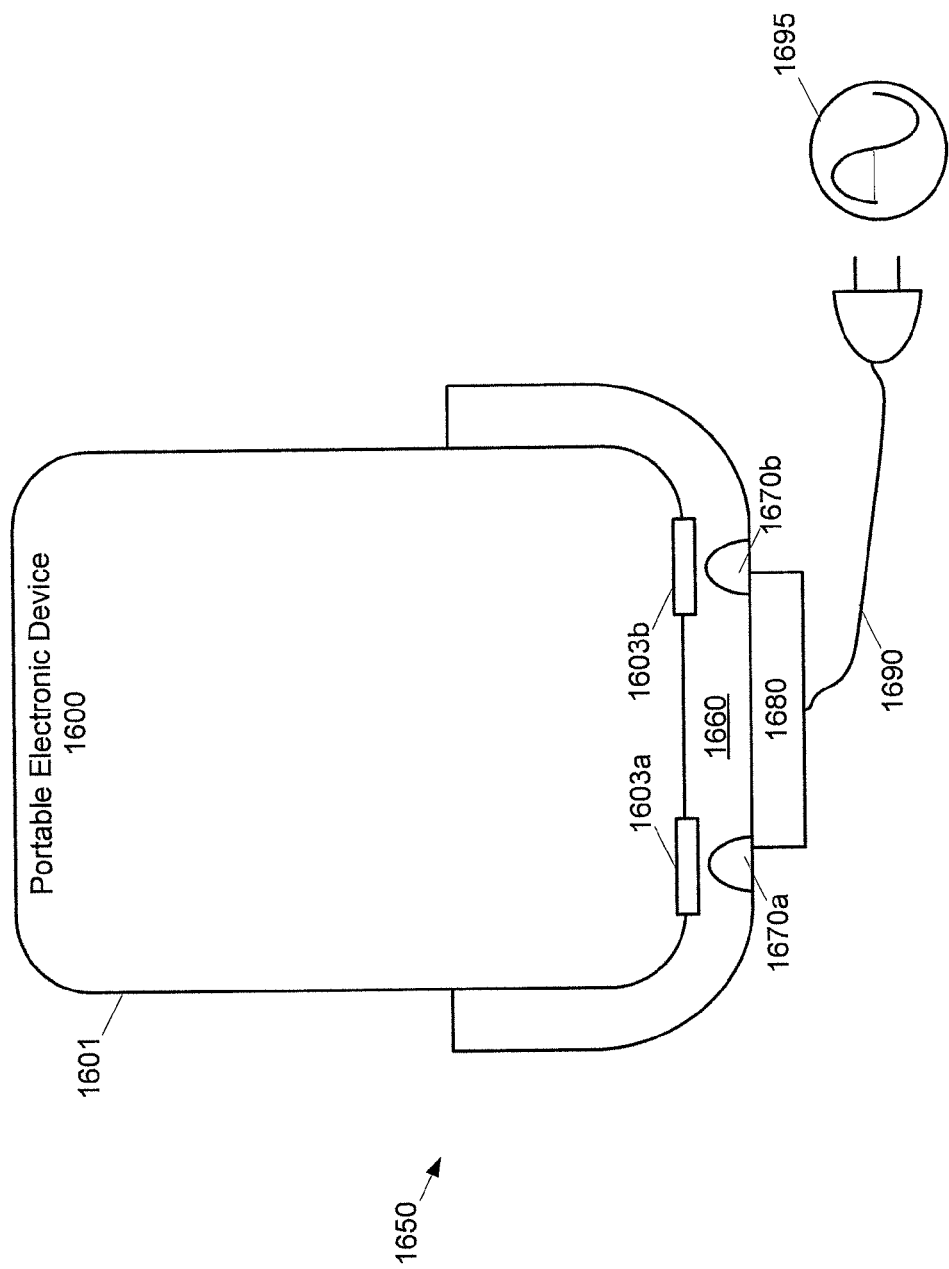
FIG. 16 depicts a portable electronic device chargeable via at least one speaker port, inserted into a complementary power supply, according to non-limiting implementations.

With reference to FIG. 16 a portable electronic device 1600 is depicted, device 1600 comprising a housing 1601 and at least one speaker port 1603a, 1603b, similar to at least one of speaker ports 303, 503, 603, 703, 803, 903, 1003, 1503. It is appreciated that at least one speaker port 1603 enables sound from at least one speaker (not depicted) to exit housing 1601, and at least one speaker port 1601 is further enabled to convey power from an external power source 1650 to a charging circuit (not depicted) in device 1600 such that a power pack in device 1600 is chargeable via at least one speaker port 1603. It is appreciated that while at least one speaker, a charging circuit, a power pack, and other internal elements of device 1600 are not depicted in FIG. 16, such internal elements are nonetheless present in device 1600, similar to devices 300, 500, 600, 700, 800, 900, 1000 and 1500.

Furthermore, it is appreciated that a portion of housing 1601, comprising at least one speaker port 1603, is enabled to mate with a cradle 1660 of an external power supply 1650, such that at least one speaker port 1603 aligns with a respective electrode 1670a, 1670b at external power supply 1650 such that at least one speaker port 1603 is in electrical contact with respective electrode 1670 when portable electronic device 1600 is in cradle 1660. It is appreciated that cradle 1660 is enabled to mate with housing 1601 to cause at least one speaker port 1603 to align with at least one electrode 1670, such that at least one speaker port 1603 is in electrical contact with respective electrode 1603, when the portable electronic device 1600 is received in cradlel 660. Hence, cradle 1660 is of a shape complementary to an end of housing 1601 comprising at least one speaker port 1603.

It is further appreciated that power supply 1650 comprises apparatus 1680 for charging circuit 1600, for example, any suitable combination of AC to DC converters, rectifiers, voltage down converters, voltage up-converters and the like. Apparatus 1680 can include a cord and plug 1690 for connection to an AC power source 1695, such as a civic power source. It is further appreciated the apparatus 1680 provides power to electrodes 1670 such that electrodes 1670 can in turn provide power to speaker ports 1603.

It is appreciated that each electrode can comprise a protrusion from a portion of cradle that receives end of housing 1601 comprising at least one speaker port 1603, in order to facilitate contact with at least one speaker port 1603.

It is yet further appreciated that a shape of electrodes 1670 facilitates contact with at least one speaker port 1603, but is otherwise non-limiting. In some implementations, however, each electrode 1670 comprises a male portion enabled to mate with a female portion of at least one speaker port 1603, for example in implementations where speaker port 1603 comprises a speaker grill 803 and/or 903. In implementations where speaker port 1603 comprises a speaker tube 1450, which comprises a conducting female receptacle, electrodes 1670 comprise a male portion enabled to mate with at least a portion of speaker tube 1450. Indeed, it is appreciated that in implementations where each electrode 1670 comprises a male portion enabled to mate with a female portion of at least one speaker port 1603, each electrode 1670 is generally complementary to at least a portion of at least one speaker port 1603.

Furthermore, in some implementations, each electrode 1670 can be spring loaded to facilitate electrical contact with respective speaker ports 1603.

In any event, as at least one speaker port 1603 is generally larger than the conductive pins they are replacing (such as conductive pins 105, 105'), at least one speaker port 1603 can be used to self locate electrodes 1670, in combination with cradle 1660.

In implementations where at least one speaker port 1603 comprises an opening and/or a female receptacle, the opening can further enable a self-locate feature in cradle 1660 as respective male electrodes 1670 insert into at least one speaker port 1603.

While specific implementations have been disclosed herein that provide a speaker for each speaker port in a one-to-one relationship, it is appreciated that any suitable number of speakers can be associated with each speaker port, and similarly any suitable number of speaker ports can be associated with each speaker. In implementations having more than two speaker ports, a subset of speaker ports can be enabled for charging a portable electronic device, while a complementary subset can function as standard speaker ports with no charging function.

It is yet further appreciated that many charging circuits, such as depicted charging circuits 330, 530, 630, 730, 830, generally comprise two electrical inputs (e.g. a high and a low input, or associated AC inputs), hence each device depicted herein comprises two charging electrodes associated with speaker ports. However, in other implementations, other charging circuits may only comprise one electrical input; in these implementations, devices similar to devices depicted herein can comprise only one charging electrode associated with a speaker port. In yet further implementations, a device similar to devices depicted herein can comprise one charging electrode associated with a speaker port and another charging electrode not associated with a speaker port.

In any event, by providing at least one at least one speaker port enabled to convey power from an external power source to a charging circuit of a portable electronic device such that a power pack of the device is chargeable via the at least one speaker port, the number of components at the device can be reduced, as can the complexity of the device and its housing, as the conductive pins are eliminated. Furthermore, such speaker ports comprising charging electrodes provide cleaner product design due to the elimination of the conductive pins. This prospective economy may be especially advantageous for portable electronic devices that are handheld, in which concerns of size and weight are especially important. Implementation of one or more embodiments may realize one or more additional benefits as well, such as flexibility of implementation. This disclosure can be adapted to a variety of portable electronic devices, a variety of power packs, and a variety of chargers.

A portion of the disclosure of this patent document contains material which is subject to copyright protection. The copyright owner has no objection to the facsimile reproduction by any one the patent document or patent disclosure, as it appears in the Patent and Trademark Office patent file or records, but otherwise reserves all copyrights whatsoever.

Persons skilled in the art will appreciate that there are yet more alternative implementations and modifications possible for implementing the embodiments, and that the above implementations and examples are only illustrations of one or more embodiments. The scope, therefore, is only to be limited by the claims appended hereto.

What is claimed is:

1. A portable electronic device, comprising:
a housing containing:
   a processing unit;
   at least one speaker for playing audio signals;
   a power pack for powering said portable electronic device, including said processing unit; and
   a charging circuit electrically connected to said power pack for charging said power pack from an external power source; and
at least one speaker port for enabling sound from said at least one speaker to exit said housing, and said at least one speaker port enabled to convey power from said external power source to said charging circuit such that said power pack is chargeable via said at least one speaker port.

2. The portable electronic device of claim 1, wherein said at least one speaker port comprises a first speaker port associated with a first speaker and a second speaker port associated with a second speaker.

3. The portable electronic device of claim 2, wherein said first speaker and said second speaker comprise stereo speakers.

4. The portable electronic device of claim 2, wherein said first speaker port is enabled to electrically connect with a first electrode of said external power source and said second speaker port is enabled to electrically connect with a second electrode of said external power source.

5. The portable electronic device of claim 1, wherein said at least one speaker port comprises at least one speaker tube enabled to contact a respective electrode at said external power supply and convey power from said external power supply to said charging circuit.

6. The portable electronic device of claim 1, wherein said at least one speaker port comprises at least one speaker grill covering said at least one speaker, said at least one speaker grill enabled to contact a respective electrode at said external power supply and convey power from said external power supply to said charging circuit.

7. The portable electronic device of claim 6, wherein said at least one speaker grill comprises a first portion and a second portion, said first portion enabled to electrically connect with a first electrode of said external power source and said second portion enabled to electrically connect with a second electrode of said external power source.

8. The portable electronic device of claim 6, wherein said at least one speaker grill comprises a split speaker grill with a first side of said split speaker grill enabled to electrically connect with a first electrode of said external power source and a second side of said split speaker grill enabled to electrically connect with a second electrode of said external power source.

9. The portable electronic device of claim 6, wherein said at least one speaker grill is one of:
flush with an outer surface of said housing;
recessed from said outer surface of said housing;
external to said outer surface of said housing; and
protruding from said outer surface of said housing.

10. The portable electronic device of claim 6, wherein at least a portion of said at least one speaker port comprises a mesh enabled to contact a respective electrode at said external power supply and convey power from said external power supply to said charging circuit.

11. The portable electronic device of claim 6, wherein at least a portion of said mesh comprises an electrode for contacting a respective electrode at said external power supply.

12. The portable electronic device of claim 1, wherein at least a portion of said at least one speaker port comprises a female electrode enabled to receive a respective male electrode at said external power supply.

13. The portable electronic device of claim 1, wherein a portion of said housing comprising said at least one speaker port is enabled to mate with a cradle comprising said external power supply, such that said at least one speaker port aligns with a respective electrode at said external power supply such that said at least one speaker port is in electrical contact with said respective electrode when said portable electronic device is in said cradle.

14. The portable electronic device of claim 1, wherein said at least one speaker port comprises a conducting material.

15. The portable electronic device of claim 14, wherein said conducting material comprises at least one of a metal, a metal coating, stainless steel, titanium, and gold.

16. The portable electronic device of claim 1, wherein said housing is enabled to be at least one of held and carried by a human hand.

17. The portable electronic device of claim 1, further comprising at least one of a portable communication device, a PDA (personal digital assistant), an MP3 player, and a mobile telephone.

18. A power supply for powering a portable electronic device, comprising:
- a cradle for receiving a housing of said portable electronic device, said housing containing a charging circuit electrically connected to a power pack for powering said portable electronic device and at least one speaker therein;
- apparatus for charging said portable electronic device; and
- at least one electrode electrically connected to said apparatus, said at least one electrode enabled to contact at least one speaker port of said portable electronic device when said portable electronic device is received in said cradle, said speaker port for enabling sound from said at least one speaker to exit said housing, and said speaker port enabled to convey power from said at least one electrode to said charging circuit such that said power pack is chargeable via said at least one speaker port.

19. The power supply of claim 18, wherein said cradle is enabled to cause said at least one speaker port to align with said at least one electrode, such that said at least one speaker port is in electrical contact with said respective electrode, when said portable electronic device is received in said cradle.

20. The power supply of claim 18, wherein said at least one electrode is at least one of:
- spring loaded;
- a male portion enabled to mate with a female portion at said at least one speaker port; and
- a protrusion from said cradle enabled to contact said at least one speaker port.

* * * * *

UNITED STATES PATENT AND TRADEMARK OFFICE
CERTIFICATE OF CORRECTION

| | |
|---|---|
| PATENT NO. | : 8,922,158 B2 |
| APPLICATION NO. | : 13/252330 |
| DATED | : December 30, 2014 |
| INVENTOR(S) | : Kwok Ching Leung |

It is certified that error appears in the above-identified patent and that said Letters Patent is hereby corrected as shown below:

In the Claims

Column 10, line 63, Claim 15, "conducing" should read --conducting--.

Signed and Sealed this
Twenty-fourth Day of November, 2015

Michelle K. Lee
*Director of the United States Patent and Trademark Office*